United States Patent [19]
Mario

[11] Patent Number: 4,922,188
[45] Date of Patent: May 1, 1990

[54] ELECTRICAL PEAK VALUE MEASURING AND EVALUATING APPARATUS

[75] Inventor: Giorgetta Mario, Winterthur, Switzerland

[73] Assignee: Kistler Instrumente AG, Wintherthur, Switzerland

[21] Appl. No.: 642,741

[22] Filed: Aug. 20, 1984

Related U.S. Application Data

[63] Continuation of Ser. No. 158,364, Jun. 11, 1980, abandoned.

[30] Foreign Application Priority Data

Jun. 22, 1979 [CH] Switzerland .................. 2925483

[51] Int. Cl.$^5$ .................. G01R 1/02; G01R 19/16
[52] U.S. Cl. ................. 324/130; 324/103 P
[58] Field of Search ............. 324/130, 103 P; 330/9; 307/549, 550, 551; 328/162, 165; 73/4 R

[56] References Cited

U.S. PATENT DOCUMENTS 3,532,980 10/1970 Tucker .................. 324/111
3,955,139 5/1976 Jenkins et al. .................. 324/130

Primary Examiner—Ernest F. Karlsen
Attorney, Agent, or Firm—Barnes & Thornburg

[57] ABSTRACT

An electrical peak value measuring and evaluating apparatus including a transmitting circuit for transmitting peak values to an output, restoring circuit for restoring the level in the transmitting circuit to a known value after reaching a peak, and a retaining circuit for retaining the restored signal at the known value until the input signal again rises above a predetermined level.

16 Claims, 4 Drawing Sheets

ELECTRICAL PEAK VALUE MEASURING AND EVALUATING APPARATUS

This is a continuation of application Ser. No. 158,364, filed June 11, 1980, now abandoned.

FIELD OF THE INVENTION

The apparatus of the present invention serves for measuring the difference of a positive or negative current or voltage peak from the preceding minimum in a periodically-variable signal, to form the mean value of these differences over a defined number of signal cycles, as well as for detecting the largest change of the difference one from the other in this number and indicating the results. A typical case of use for this apparatus is the monitoring of the cylinder pressure of internal combustion engines. The invention is explained hereinafter with reference to this example.

BACKGROUND OF THE INVENTION

The cylinder pressure of an internal combustion engine is measured by pressure transducers with associated electronic circuitry. The result of the measurement is available in the form of a current or voltage quantity which is proportional to pressure and by which the individual peak values are detected with electrical means. Thereupon, the mean value, as well as the difference between the lowest and the highest peak value within a number of N peak values, is determined from this defined number N of these values. This purely-electronic apparatus is suitable quite generally for the evaluation of periodic mechanical measuring quantities which have been converted to electrical quantities by various types of transducers.

The peak pressure of internal combustion engines may rise in the course of operation, and this may lead to overloading of various parts, in particular the bearings. This leads to fracture and failure of the engine. In order to be protected against such undesirable surprises, it is usual in particular in large Diesel engines, to measure the peak pressures from time to time and to correct them, if necessary. A correction is also necessary when these values are too low, in order to reduce the fuel consumption.

For a long time, mechanical peak pressure meters of relatively small size have been known which are portable and which are predominately used in connection with Diesel engines. All of these systems are based on a piston or valve plate which is displaceable in a cylinder member. The ignition pressure is guided into this cylinder member, thus displacing the piston against a spring. Depending upon the model, the indication of the pressure is effected in various ways. In one known form of peak pressure meter, the piston displaces a writing pen on paper in the vertical direction. The length of the line gives the measure of the peak pressure. With horizontal advance of the paper, the pressure-time diagram of the cylinder pressure is recorded. In a further system, the spring pressure is adjusted until it is just so large that the peak pressure is insufficient to shift the valve plate. The spring bias is then detected as the measure for the peak pressure and is read off a scale.

All of these mechanical systems assume that an indication tube is present on the motor which permits the peak value measuring apparatus to be connected to the engine cylinder. This indicator tube is the cause of various difficulties which lead to measuring errors. The indicator tube constitutes a blind duct which is connected to the combustion space and is known to generate whistle oscillations in response to the rapid pressure rise in the combustion space. This causes a falsification of the pressure course and, in the peak value measuring apparatus, an erroneous indication of the peak values. Moreover, these indicator tubes are inclined to carbonize, this likewise leading to measuring errors.

Accordingly, piezoelectric pressure transducers are preferred which are built directly into the combustion space, flush with the wall thereof, whereby the undesirable influence of the blind duct is eliminated. Piezoelectric pressure transducers can be constructed to be very small and may be integrated in a spark plug. Thereby, it is possible to measure pressure courses in Otto engines without an indicator tube or indicator bore.

For an indication of cylinder pressure by means of piezoelectric pressure transducers heretofore, additionally an electrometer amplifier or charge amplifier was necessary in order to convert the pressure-proportional charge delivered by the transducer to a measuring voltage, as well as a light beam oscillograph for recording the pressure diagram. However, with such an arrangement, the cost is so large that the measurements are performed, for the most part, only by the manufacturers of the engines and do not come into practical use for servicing work by the user of the engine.

In the peak value measuring and evaluating apparatus described herein, a piezoelectric transducer is used. The electrical measuring signal produced by the transducer is not, however, recorded by a light beam oscillograph, but rather, the said apparatus measures the peak values of each pressure cycle during a defined number of N cycles and the mean value as well as the deviation of the lowest from the highest peak value is determined and indicated therefrom. Thus, the apparatus directly makes that evaluation which heretofore was obtained only in the office as a belated evaluation of the oscillograph diagram. The piezoelectric pressure measuring method permits only the measurement of relative pressures. Absolute pressures, such as measured by the described mechanical peak pressure measuring apparatus, cannot be handled thereby.

As in other arrangements, piezoelectric measuring chains, too, have the property that the signal zero point drifts away during the measurement. Admittedly, it is possible to balance the signal zero point at the beginning of the measurement with the engine at standstill in such a manner that, with the pressure zero at the pressure transducer, the indicator, measuring or register apparatus is likewise at zero. However, in the measuring operation with the engine running, the zero point is displaced in consequences of the heating of the transducer in the engine as well as by interferences charges caused by the charge amplifier or electrometer amplifier and finally by the dynamic transfer characteristic of the measuring system. When, after completed measurement, the pressure at the transducer is zero again, the signal zero point can then differ greatly from its original position at the beginning of the measurement. For a faultless measuring result, this zero point drift error must be taken into account continuously during the measurement. For assessing the course of combustion in an engine cylinder, it is insufficient to know the particularly-high peak value of a single combustion, such as detected by individual mechanical peak value meters. It is desirable to know the mean value of a certain number of peak pressures as well as the stray width thereof. This necessitates a measurement over a period of time during which the drift error may even assume impermissibly-large dimensions.

The development engineer on the test bed of the manufacturer can draw into its pressure-time diagram the zero line which has drifted away, can measure the peak pressures and average them as well as form the peak pressure stray by a graphic-calculatory method. However, this possibility is not available to a serviceman. Even if he could carry with him the apparatus, he would hardly have the time and the possibility to be able to perform this graphic evaluation. The apparatus described in accordance with the present invention, however, performs by itself this evaluation practically instantaneously. However, the use of this peak value measuring and evaluating apparatus is not limited only to piezoelectric transducers. It can also be used in conjunction with any other electro-mechanical transducer systems in which zero drift problems occur. Generally, the use is not limited to transducers; it extends to every situation where the demand is for the zero point related signal course of a periodic measurement voltage, where the measurement signal zero point varies.

BRIEF DESCRIPTION OF THE INVENTION

The invention is based on a novel peak-peak measuring method with the electrical circuits necessary therefor.

In this regard, the present invention provides a peak value measuring and evaluating apparatus for an electrical alternating voltage for effecting measurement over a defined number of cycles of the alternating voltage, characterized by apparatus for the restoration of a reference value for the measurement of the peak values which sets the signal level to a constant and known value after the peak value of a positive or negative signal pulse, respectively, has been reached, and retains the said value until the signal rises again.

In dynamic measuring systems of the type described, it is usual to employ capacitive signal decoupling to eliminate or at least reduce zero point instabilities by connecting a high pass filter to the line carrying the alternating voltage. However, while this expedient admittedly effects a reduction in the zero point fluctuations, it also produces noticeable distortion of the measuring signal. In this regard, the high pass filter not only falsifies the amplitude and zero point of the measuring signal, but also effects the time of occurrence of the signal maximum and minimum, whereby a phase shift is introduced in the measuring signal with respect to the true signal course.

In accordance with the present invention, an improved measuring circuit is provided which includes a junction field effect transistor connected between the line carrying the alternating voltage at the output of the signal decoupling capacitor and the system reference ground. In addition, a diode is connected in parallel with the junction field effect transistor, so that both positive and negative drifting signals can be controlled to effect restortion of the reference value for the measurement of the peak value of the alternating voltage.

A further feature of the present invention relates to a control arrangement for automatically controlling the operation of the junction field effect transistor, including a Schmitt trigger circuit which detects the peak in the alternating voltage waveform and a monostable circuit controlled by the Schmitt trigger circuit to drive the voltage waveform to the reference level of the system after the peak in the alternating waveform has passed.

While a single diode may be connected between the line carrying the alternating voltage at the output of the signal decoupling capacitor and ground, it is also advantageous in accordance with the present invention to provide this function through the use of an operational amplifier in combination with a rectifier. This serves to eliminate any undesirable effects on the measurement as a result of the threshold voltage of the diode.

The measuring problem, the measuring method as well as the measuring circuit and the advantages derived therefrom will be explained in greater detail hereinafter with reference to the accompanying drawings.

BRIEF DESCRIPTION OF THE DRAWINGS

FIG. 3b illustrates the true pressure course in a Diesel engine cylinder in comparison with the measuring signal distorted by the capacitive decoupling according to FIG. 3a;

DETAILED DESCRIPTION OF THE PREFRRED EMBODIMENTS

Figure 1:
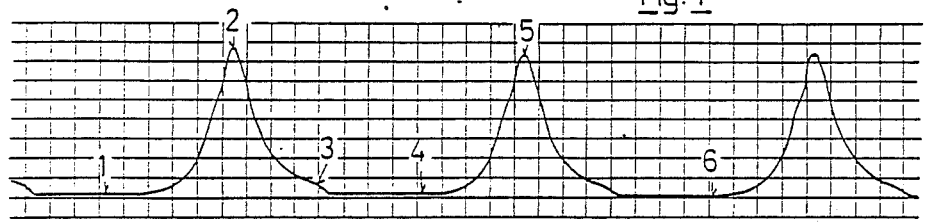
FIG. 1 is a typical diagram of the pressure course in the cylinder of a large Diesel engine, in dependence upon time, at a rotary speed of 96 revolutions per minute, wherein the horizontal time scale amounts to 0.05 s per division line and the vertical pressure scale amounts to 12.5 bar per division line.

FIG. 1 illustrates the recording of the pressure course in dependence upon time in the cylinder of a two-stroke heavy Diesel at a rotary speed of 96 revolutions per minute. In this case, point 1 indicates the lowest cylinder pressure, point 2 the peak pressure, point 3 the opening of the outlet slots, point 4 again the lowest cylinder pressure during the gas change phase, point 5 the peak pressure, and point 6 the lowest cylinder pressure.

Of particular interest are the values of the peak pressures of the individual signal cycles. However, these peak values are difficult to read off the diagram, since uncertainty exists in the diagram with respect to the zero point or level of the waveform. Admittedly, it is possible to place the recording line at the beginning of the measurement, for example, on the lower scale edge, but this zero position undergoes a displacement during the starting and warming-up phases of the engine. If then the measuring value level is referred to the zdro position adjusted at the beginning, a large measuring error may result. However, it is known that during the gas exchange portion of the operating cycle, the pressure in the Diesel cylinder corresponds to a charging pressure of approximately 3 bar. The difference pressure between the lowest cylinder pressure and the peak pressure, point 1 to point 2, or point 4 to point 5, respectively, of the diagram of FIG. 1 must be added to this charging pressure.

It is clear from the diagram of FIG. 1 that the lowest diagram point of the cylinder pressure 6 is located lower than the corresponding lowest point of the cylinder pressure 4, although the pressures are the same. This is a consequence of negative zero point drift. Upon change of the zero point, a corresponding position change of the lowest diagram points of the cylinder pressures 1, 4, 6, . . . occur, but these correspond always to 3 bar.

Figure 2:
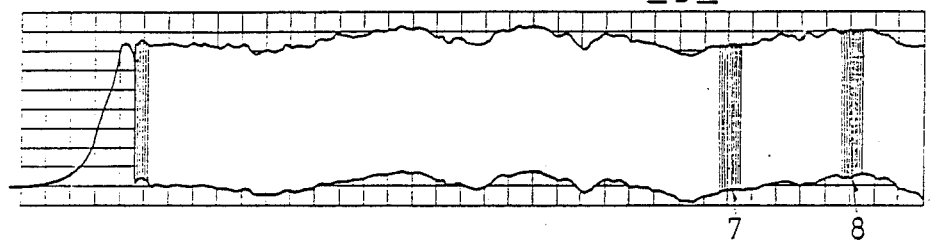
FIG. 2 is the same diagram as FIG. 1, but with a time scale of 5 s per division line.

The diagram of FIG. 2 illustrates the sequence of a large number of pressure cycles with a horizontal paper advance which is a hundred times smaller in comparison with the diagram of FIG. 1. The lower edge of the measuring signal band shows the course of the gas change point. A group of 40 signal cycles lies between the lowest cylinder pressures 7 and 8. During this interval, the zero point shifts by about one division line, which corresponds to a recalculated pressure of 12.5 bar. Accordingly, when the peak pressure values of these 40 cycles are referred to the level of the lowest cylinder pressure 7, an error of 12.5 bar, or a mean error of ±6.25 bar, respectively, is obtained. When referred to the peak value of approximately 100 bar in the pressure, this results in the intolerable error of +6.25% or −6.25%, respectively. Consequently, the zero point displacement must be taken into account for the perfect measurement of the peak values.

A zero point instability, such as shown by the lower edge of the band in FIG. 2, is a consequence of chronologically-varying heat effects upon the pressure transducer, caused by different gas streams during the combustion phase of individual cycles. Admittedly, one source of error is reduced by the avoidance of the indicator tube and the whistle oscillations occurring in conjunction therewith; instead, however, an increased displacement of the signal zero point occurs, due to the direct insertion of the transducer into the engine cylinder and thereby the direct contact with the flame front of the pressure transducer. Such a zero point displacement does occur not only with piezoelectric transducers, but in a similar manner also occurs with transducers of other systems. In the electric circuit technique, it is usual to eliminate or at least to reduce zero point instabilities, such as shown in FIG. 2, by capacitive signal decoupling, as shown in FIG. 3a.

Figure 3A:
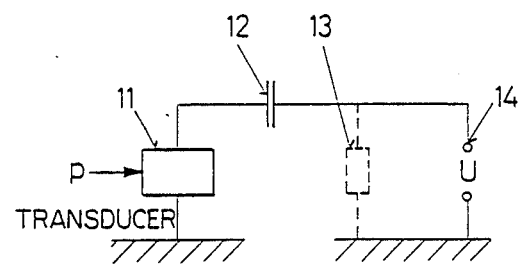
FIG. 3a is a schematic circuit diagram which illustrates diagrammatically the capacitive decoupling of a signal detected piezoelectrically, by means of which zero point displacements of the measuring signal in consequence of drift influence are reduced.

The circuit of FIG. 3a comprises a pressure transducer 11, a coupling capacitor 12, a bleeder resistor 13 and a signal output terminal 14 for a following amplifier. The input resistance of the following amplifier frequently assumes the function of the bleeder resistor 13, whereby the latter can be omitted. For this reason, it is drawn in broken lines in FIG. 3a.

The circuit of FIG. 3a constitutes a high-pass filter which therefore lets high frequencies pass and blocks low frequencies. A pressure measuring signal, such as shown in FIG. 1, has a cycle frequency of at least 1 Hz, whereas the zero point fluctuations according to the diagram of FIG. 2 comprise frequency components of approximately 1/100 Hz. The limit frequency of the filter according to FIG. 3a results from the lowest measuring frequency value to be transmitted and the highest interference signal frequency value to be blocked. It should lie approximately between these frequency values, that is to say, at 0.1 Hz. However, the spacing of the filter limit frequency from the interference signal frequency as well as from the measuring signal frequency is for the most part too small, whereby admittedly, on the one hand, zero point flucutations are considerably reduced, but continue to be troublesome, and on the other hand, the measuring signal is distorted.

Figure 3B:
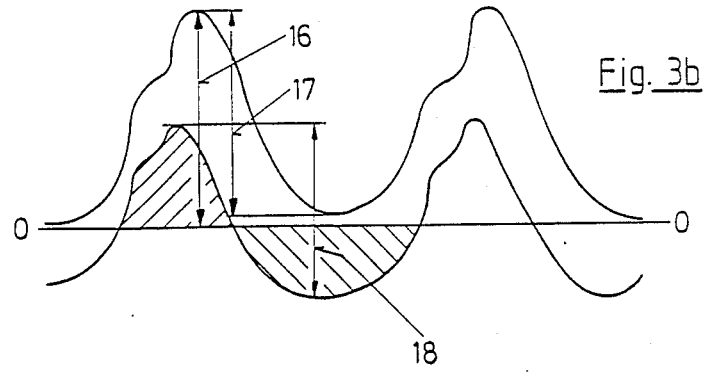

The upper diagram in FIG. 3b illustrates the true course of the cylinder pressure, the dimension 16 denoting the amplitude of the peak pressure and the dimension 17 denoting the pressure difference between the lowest pressure and the peak pressure. The lower diagram illustrates the measuring signal which has been distorted by the filter according to FIG. 3a. The measuring signal is distributed about the zero line in such a manner that the positive area parts located above the line correspond aproximately to the negative area parts which are located below the line. Therefore, the gas exchange point is stable in relation to the zero line only for so long as the form of the graph and amplitude of the measuring signal are constant. A change of the same changes also the area relationships relatively to the zero line, and consequently, effects an area compensation and thereby a zero point drift which depends upon the shape and the graph and the amplitude. Furthermore, the pressure difference 18 is reduced relatively to the pressure difference 17, this being a consequence of the frequency dependence on the measuring signal amplitude in this filter frequency range. However, this filter does not only falsify the amplitude and zero point of the measuring signal, but also affects the time of occurrence of the signal maximum and minimum. This occurs too early, whereby a phase shift to the left takes place; and, the measuring signal runs ahead of the true course. All of these factors render the discussed measuring circuit unsuitable for the present measuring problem.

Figure 4A:
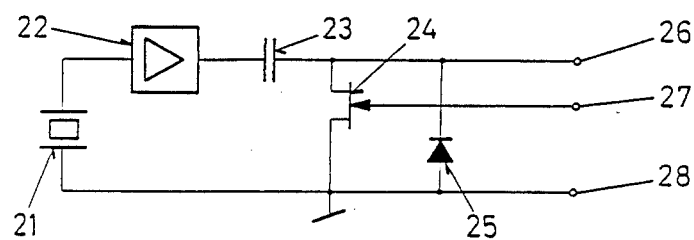
FIG. 4a is a schematic circuit diagram which illustrates capacitive decoupling by means of a rectifier diode and a junction field effect transistor in accordance with this invention.

FIG. 4a illustrates an improved circuit, including a pressure transducer 21, an impedance converter 22, a coupling capacitor 23, a junction N-channel type field effect transistor 24, a diode 25, a signal output terminal 26 to the following amplifier, a control connection terminal 27 for the junction FET 24, and a ground terminal 28 forming the reference point of the measuring system.

Figure 4B:
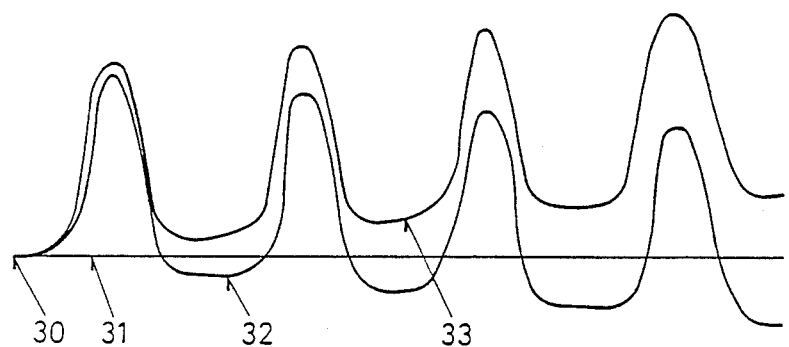
FIG. 4b illustrates a sequence of pressure cycles in a Diesel engine cylinder with positive as well as negative drift.
Figure 4C:
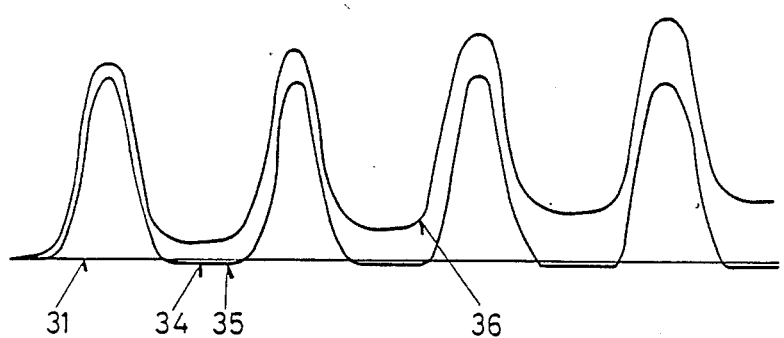
FIG. 4c illustrates the influence of the circuit of FIG. 4a on the measuring signals of FIG. 4b with the junction field effect transistor cut-off.

When the control connection 27 is connected to ground potential, the junction FET 24 is conductive and the signal output 26 is therefore short-circuit to ground by way of the junction FET 24. Consequently, signal transmission from the pressure transducer 21 to the signal output terminal 26 cannot occur. In order to render such transmission possible, the control connection 27 must be given a negative voltage potential, whereby the junction FET 24 becomes nonconductive and isolates terminal 26 from ground. Then, however, only measuring signals which are positive relative to ground can reach the signal output terminal 26; negative signals are again short-circuited to ground, this time by way of the diode 25 which is connected in parallel with the junction FET 24. FIGS. 4b and 4c illustrate this behavior with reference to the corresponding diagrams.

FIG. 4b illustrates the course of the measuring signal at the output of the impedance converter 22 in FIG. 4a. The measuring signals 32 and 33 begin always with the lowest cylinder pressure 30 on the zero line 31. Both signals are identical to each other, except for the zero drift which occurs for the measuring signal 32 in a negative direction and for the measuring signal 33 in a positive direction. Simultaneously with the lowest cylinder pressure 30, the control connection terminal 27 in FIG. 4a is rendered negative, whereby the junction FET 24 cuts off. The measuring signal 33 then appears unchanged at the signal output terminal 26, as shown by the measuring signal 36 in FIG. 4c. In contrast thereto, the negatively-drifting measuring signal 32 is corrected by the diode 25 in the manner which is clear from the measuring signal 34 in FIG. 4c. Owing to this diode 25, the voltage at the signal output 26 can become only slightly negative, i.e., approximately −0.7 V. This corresponds to the threshold voltage of the diode 25. Since during the short-circuit phase by the diode 25, the coupling capacitor 23 undergoes a corresponding charge shift by way of the diode 25, the measuring signal at the signal output terminal 26 does not change again until it has a rising tendency (after point 35 in FIG. 4c). It then moves away from the threshold voltage of the diode, attains the peak value and drops again to the threshold value during the gas change phase. Point 35 corresponds to the lowest cylinder pressure during the gas exchange phase, that is to say, approximately 3 bar.

The electronic evaluation circuitry connected to terminal 26 detects the peak value and adds thereto the threshold value of the diode. This, multiplied by the pressure-voltage conversion factor of the transducer and taking the loading pressure into account, provides the absolute peak pressure. Thus, the diode has the function of a zero point compensator which stabilizes the signal zero point for the gas change pressure to a defined voltage potential.

However, this method operates perfectly only for so long as a negative zero point drift of the measuring signal is present, such as is shown by the measuring signal 32 in FIG. 4b. With a positive drift, such as shown by measuring signal 33, or when there is no drift at all present, the diode can never become active, since in this case no negative signal level is generated. Thus, positively-drifting measuring signal is transmitted unchanged together with the drift, such as illustrated by the measuring signal 36 in FIG. 4c. In this case a remedy can then be provided by an artificially-produced short-circuit phase at the opportune moment, whereby a negative drift is produced by the supply of a negative charge to the coupling capacitor. The short-circuit is produced by means of the junction FET 24, in that its control connection terminal 27 is connected to ground terminal 28 for the required duration.

Since the measuring signal course is basically of interest only from the lowest cylinder pressure to the attainment of the peak value (49 . . . 50, 44 . . . 51, etc. in FIG. 4d), the short-circuit phase may occur at any desired instant of time after passing the peak value to the lowering of the measuring signal level to a value which still lies, to the extent of the threshold voltage of the diode 25, above the zero line or above the ground level, respectively, and at least by the same amount above the lowest cylinder pressure.

Figure 4D:
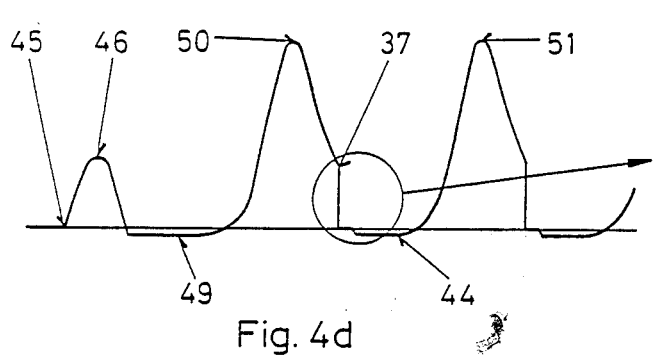
FIG. 4d illustrates the influence of the circuit of FIG. 4a on the measuring signal of FIG. 4b with positive drift when, during the signal decay phases, the junction field effect transistor is rendered conductive by short zeroing pulses at its gate connection.
Figure 4E:
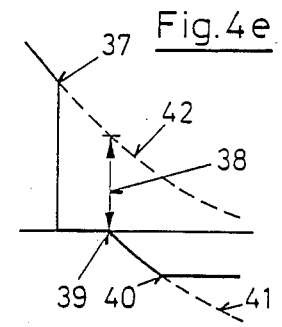
FIG. 4e illustrates a section with the zeroing phase in FIG. 4d, in detail on an enlarged scale.

FIGS. 4d and 4e illustrate a measuring signal diagram of the signal output at terminal 26 in FIG. 4a. FIG. 4e shows a section of FIG. 4d on an enlarged scale in detail. Point 37 signals the beginning of the short-circuit phase, and point 39 the end of the short-circuit phase. This is thus very short in comparison with the measuring signal cycle. By short-circuiting the signal output terminal 26 in FIG. 4a to ground at the start of the short-circuit phase 37, (FIGS. 4d and 4e) the coupling capacitor 23 is supplied with so much negative charge that the measuring signal at the signal output terminal 26 possesses a negative level displacement by the compensation amount 38 at the end of the short-circuit phase 39 (FIG. 4c). Then, however, the measuring signal still drops to the lowest cylinder pressure. The broken line 42 illustrates the course of the measuring signal without the short-circuit phase. The line 41 illustrates the measuring signal course displaced by the compensation amount 38. Thus, the measuring signal level drops to the negative diode threshold voltage level 40, independently of the drift direction of the zero point of the measuring signal, whereby the stabilization of the zero point of the measuring signal by means of the zero point compensation effect of the diode 25 is ensured.

Figure 5A:
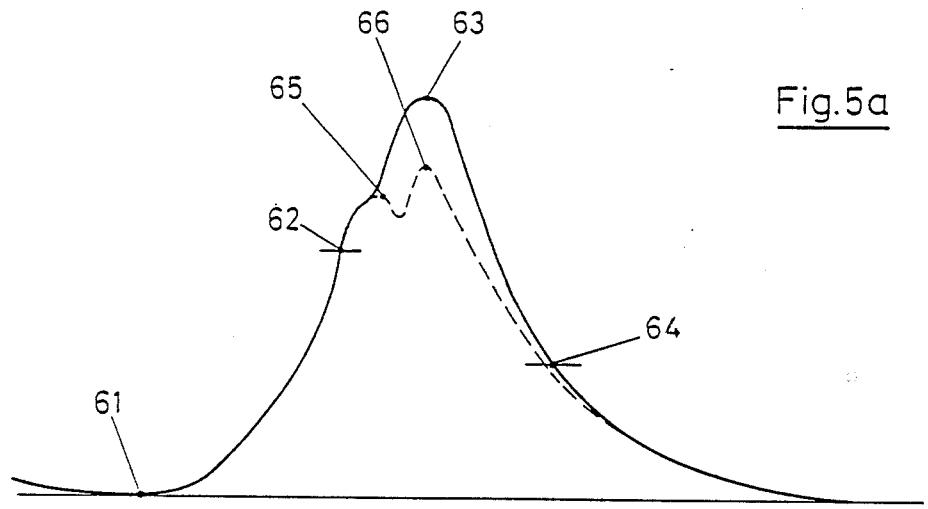
FIG. 5a illustrates an explanatory diagram of the pressure course in the cylinder of a Diesel engine with the switching functions of a Schmitt trigger.
Figure 5B:
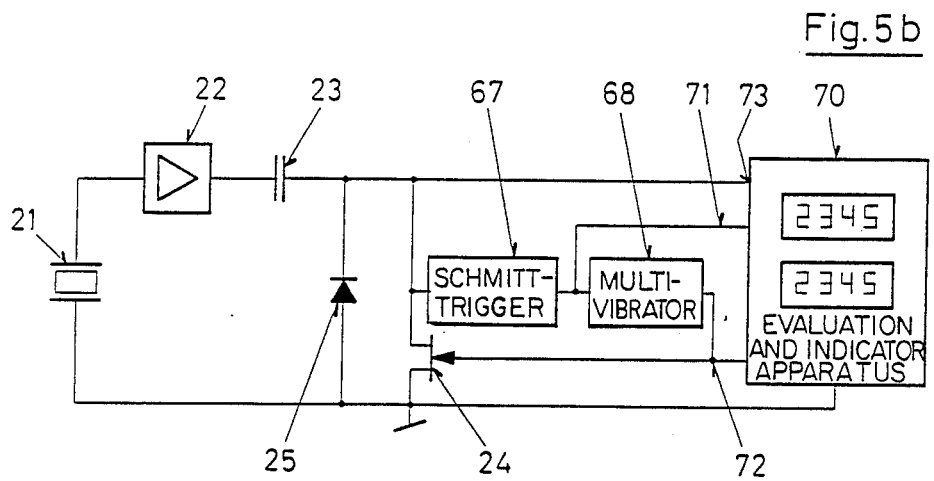
FIG. 5b illustrates the circuit of FIG. 4a with automatic control of the junction field effect transistor.

According to the invention, the zeroing signal required for realizing the short-circuit phase is triggered by the measuring signal cycles themselves. FIGS. 5a and 5b show how this may be effected. The lefthand portion of FIG. 5b with the pressure transducer 21, impedance converter 22, coupling capacitor 23, junction FET 24 and diode 25 corresponds to the circuit according to FIG. 4a. Additionally, this circuit is enlarged by a Schmitt trigger 67 or a similar circuit as well as by a monostable multivibrator 68 or a similar circuit and furthermore by a control, indicator and evaluation apparatus 70. The control, evaluation and indicator apparatus 70 hoods the control lead of the junction FET 24, that is to say, the gate connection thereof, at zero potential prior to the start of the measurement, and prevents thereby the transmission of the measuring signal to the signal input 73 of the evaluation apparatus which itself is in the zero state. As soon as the measurement is to begin, the gate connection of the junction FET 24 is set to negative potential by means of the start command signal by way of the control line 72, whereby the junction FET 24 cuts off. The cut-off resistances of the diode 25 and the junction FET 24 as well as the input resistances of the Schmitt trigger 67 and the evaluation apparatus are very high. Consequently, the transmission time constant of the circuit, being a product of the values of the insulation resistance and the coupling capacitor 23, is likewise very high, which results in a correspondingly-low limit frequency. Thus, none of the measuring signal distortions occur which are produced in the manner illustrated in FIG. 3b.

When a certain pressure or voltage level, respectively, is reached at the signal input 73 of the evaluation apparatus, or at the input of the Schmitt trigger 67, respectively, the latter switches from zero to 1, i.e., the output potential thereof jumps from zero or negative feed voltage potential to positive feed voltage potential.

In the diagram of FIG. 5a, this switch-on level is constant relative to the signal zero point 61 and is denoted by the point 62. After the measuring signal has passed the peak value 63, it runs in the next following dropping phase through the switch-off level 64 at which the Schmitt trigger switches back from 1 to zero. This switch-off level 64, too, is constant relative to the signal zero point 61 and cannot thus be influenced by the measuring signal. The reset transient then energizes the monostable multivibrator 68, whereby its output is provided with a constant pulse having a pulse width corresponding to the time interval from the beginning of the short-circuit phase 37 to the end of the short-circuit phase 39 according to FIG. 4e. During this active period of time, the voltage at the multivibrator output 68 amounts to zero, whereas in the inactive state, that is to say, during the remaining period of time, it is located at negative voltage potential. Owing to the connection of the multivibrator output to the control line 72 and thus to the gate connection of the junction FET 24, the previously-mentioned short-circuit phase is realized thereby, in consequence of which the signal zero point level for the next following measuring signal cycle is stabilized. Thus, the short-circuit phase takes place always at that instant of time at which the measuring signal level, dropping away from the switch-on level 62 in FIG. 5a, runs through the switch-off level 64.

The control, evaluation and indicator apparatus 70 detects and processes a certain number of peak values of the measuring signal cycles, in order to block thereafter any further transmission of measuring signals by a constant zero potential at the control line 72. For this purpose the control, evaluation and indicator apparatus 70 must count the processed signal cycles and compare them with the nominal value. For signal processing it adds the individual peak values of the signal cycles one to the other and forms the mean value; in addition, it determines the differences between the largest and the smallest peak value, and finally, it indicates the mean value and the difference. The start of the measurement is initiated by the manual actuation of a start key. However, the signal processing does not start then at once. Since the start key is depressed at any desired instant of time, the measuring signal level may be located at this instant at any haphazard value within its measuring range and comprise any haphazard movement direction. In the cut-off state of the circuit, that is to say, with zero potential on the control line 72, so much charge is supplied to and away from the coupling capacitor 23 that the sum of the output voltage of the impedance converter 22 with the voltage drop at the coupling capacitor 23 always results in zero at the input 73 of the evaluation apparatus. Consequently, at the instant of the start command signal and the omission of the charge shift of the coupling capacitor 23 which has occurred thereby, the zero level of the input signal of the evaluation apparatus is fixed at the instantaneous level of the output signal of the impedance converter 22 and is thus mostly located in the wrong position. In this case, fundamentally two different situations may arise:

(a) The start command occurs during the falling phase of the measuring signal. As already known, the zero point at the signal input 73 of the evaluation apparatus is stabilized until the measuring signal exhibits a rising tendency again. This is then the case again only with the next following measuring signal cycle, whereby then the zero point is correct for the same.

(b) The start signal occurs during the rising phase of the measuring signal, such as is the case at the start instant point 45 illustrated in FIG. 4d. The measuring signal appears then at the signal input 73 of the evaluation apparatus with an amplitude from the start instant point 45 to the peak value 46 and thus exhibits mostly a wrong value. However, the peak value 50 of the next following measuring cycle is correct.

Situation b defines then generally the condition that the control, evaluation and indicator apparatus 70 is permitted always to start the signal processing only with the second arriving measuring cycle signal. The evaluation apparatus utilizes the reset transient of the Schmitt trigger 67 as a measuring cycle counting signal. Thus, it may happen in this way that the first transmitted peak value 46 is so small that it is regarded as an interference signal by the Schmitt trigger 67 and therefore does not produce a reset transient. The second peak value 50, the level of which is now correct, produces a first reset transient and is thus not yet processed by the control, evaluation and indicator apparatus 70, which occurs only with the third transmitted measuring cycle with its peak value 51. The measuring cycle counting signal or the reset transient, respectively, is transmitted by the line 71 in FIG. 5b.

Basically, even further circuit possibilities exist for the realization of the control of the starting instant point for the short-circuit phase. The main condition therefore remains that this instant of time must occur during the signal decay phase after the peak value has been passed. Thus, for example, the starting point may be determined by differentiation of the measuring signal. In this case, the monostable multivibrator is energized whenever a signal with falling tendency is present in the measuring channel, and thus the short-circuit phase is initiated. However, this may lead increasingly to error measurements, as will be explained hereinafter with reference to the broken-line course of the digram of FIG. 5a.

A Diesel engine running in idling operation frequently produces a compression pressure, such as seen at point 65, forming a first pressure maximum, as seen at point 66. If energization of the monostable multivibrator 68 were to occur as a consequence of each negative measuring signal differential coefficient, this energization would occur erroneously after the compression pressure 65 has been attained. However, because of the Schmitt trigger circuit in which a defined hysteresis is present between the switch-on level and switch-off level 62 and 64, respectively, which is constant in relation to the circuit zero point, such error functions are reduced to a minimum.

A further difficulty in respect of time differentiation of the measuring signal is provided by a measuring signal which changes very slowly, as this is the case, for example, when monitoring the pressure in the manipulation of synthetic resin material. In this case a differential signal of very small value is produced. Moreover, interference signals, such as hum and switching surges, also lead increasingly to the energization of the multivibrator at the wrong instant of time and thereby to error measurements. Thus, quite generally the whole problem resides in the correct classification of the measuring cycle from the measuring signal. This classification is ensured to the full extent by the described measuring method owing to the Schmitt trigger 67 with hysteresis.

Figure 6:
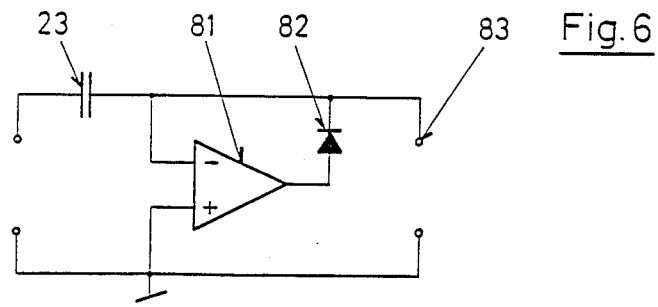
FIG. 6 is a schematic circuit diagram of a capacitor charge-shift circuit with an operational amplifier.

FIG. 6 illustrates an improvement of the circuitry technique of the circuit of FIG. 5b, in that the combination of the diode 82 with the operational amplifier 81 takes the place of the diode 25 in FIG. 5b. Negative potential transmitted by the coupling capacitor 23 to the signal output 83 is effective also at the inverting input of the operational amplifier, which is consequently rendered positive at its output. Thereby, a positive compensation charging current flows through the diode 82 into the coupling capacitor 23, whereby the inverting amplifier input and the signal output 83, respectively, remain at zero. In contrast thereto, a positive potential transmitted by the capacitor is not influenced by this arrangement. Although the operational amplifier 81 is rendered negative thereby, a negative compensation charge current cannot flow, since such current is blocked by diode 82. When the diode 82 is conductive, the output of the operational amplifier 81 is at the threshold potential of the same. In practice, this voltage of approximately 0.7 V amounts to approximately 7 $\mu$V at an internal amplification of the amplifier 81 of $10^5$ referred to its input; thus, the input remains practically at zero. Thereby the input impedance of the operational amplifier 81 is of infinitely-high resistance for signals of positive level, but is of infinitely-low resistance for signals of negative level, that is to say, it is zero. The reference point for these levels is formed by the non-inverting input of the operational amplifier 81 which is connected to the ground terminal of the system. Thus, the diode threshold voltage is eliminated from the preceding arrangement which originates from the known precision rectifier circuit. Its use in the diagram of FIG. 5 results in the following advantages:

1. The threshold voltage of diode 25 which must also be taken into account for the signal evaluation may be individually different, this leading to measuring uncertainties. Owing to its value-wise reduction by the factor of the internal amplification of the operational amplifier 81, this threshold voltage together with its spreads can be disregarded. The same applies to the influence of the temperature on the threshold voltage.

2. The charge shift of the coupling capacitor 23 in the time interval from the beginning of the short-circuit phase 37 to the end of the short-circuit phase 39 (FIG. 4d) together with the foot point of the junction FET 24 is referred to the ground level of the system. However, the stabilization of the signal zero point occurs at a level which differs from the zero point of the system by the diode threshold voltage of diode 25. Thereby, the stabilization is attained only if after the end of the short-circuit phase 39 the measuring signal voltage level drops still further by at least the diode threshold voltage amount. This condition becomes superfluous owing to the reduction of the threshold voltage to a negligible amount and the coincidence connected therewith of the system zero point with the stabilizing level for the signal zero point.

3. The static as well as the dynamic internal resistance of the diode is likewise reduced by the factor of the internal amplification of the operational amplifier 81, this reducing correspondingly all influences caused thereby. Above all, an error-less measuring operation is ensured thereby even at a high cycle frequency, when rapid charge shift of the coupling capacitors 23 is important.

Figure 7:
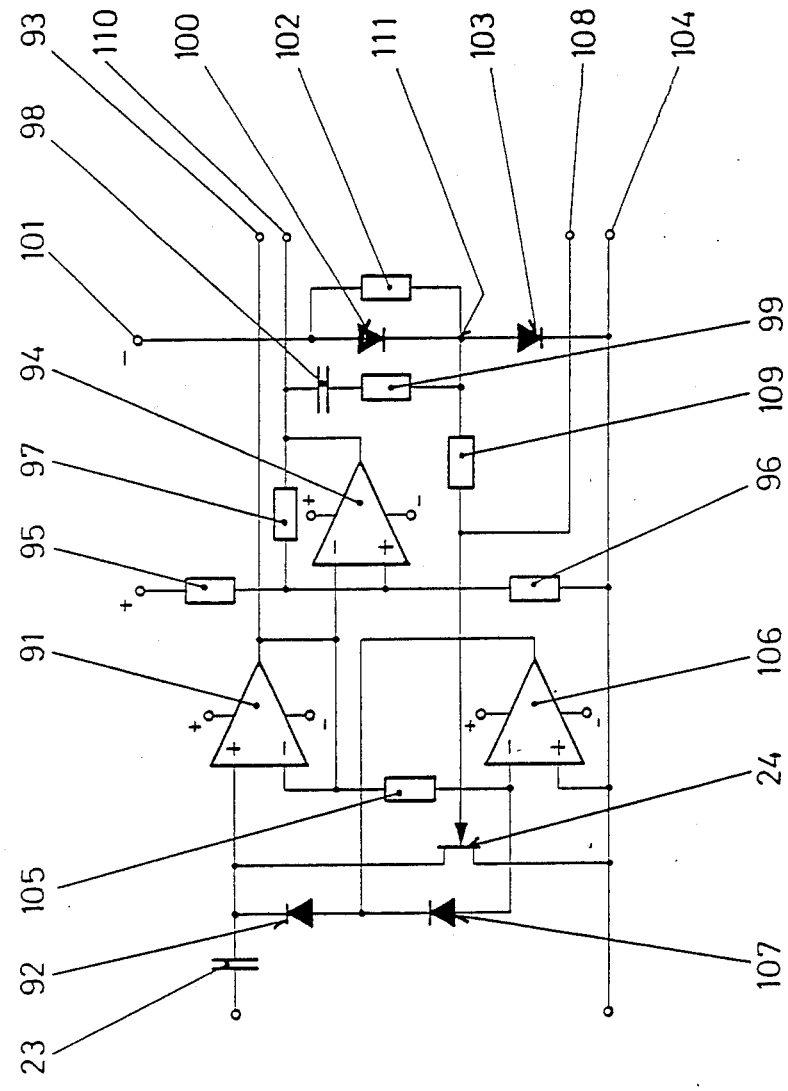
FIG. 7 illustrates a complete circuit diagram of the zeroing device for positively-deflected signal cycles in accordance with this invention.

The circuit portion 5b with the coupling capacitor 23, the junction FET 24, the diode 25, the Schmitt trigger 67 and the monostable multivibrator 68 is illustrated merely in a schematic diagrammatic manner. FIG. 7 illustrates a detailed circuit of these component parts with substitution for the diode 23 of a circuit operating in accordance with the combination discussed with reference to FIG. 6.

Reference numeral 23 denotes again the coupling capacitor which transmits signals of positive level to the further circuit. These are fed to the non-inverting input of the operational amplifier 91. In this case diode 92 as well as the junction FET 24 are cut-off. The operational amplifier 91 has the function of an impedance converter with a high input resistance and transmits the signal further to the signal output terminal 93. The latter is connected to the input of the evaluation and indicator unit. The employment of the operational amplifier 91 has the result that the transmission time constant for measuring signals by the coupling capacitor is extremely long, thus excluding a distortion of the signal course. The output of the operational amplifier 91 leads also to the inverting input of the operational amplifier 94 which is connected as a Schmitt trigger. Its non-inverting input is connected to a positive voltage divider consisting of the resistors 95 and 96. Therefore, it is positively biased, whereby the output voltage of the operational amplifier 94 remains in the positive limitation for as long as the level at its inverting input is more negative than this bias voltage. In addition to the resistors 95 and 96, the bias voltage is also determined by the feedback resistor 97. The latter effects an additional positive displacement as long as the voltage at the amplifier output lies in the positive domain. As soon as the voltage at the inverting input of the operational amplifier 94 rises above the bias voltage level at the non-inverting input due to the measuring signal, the amplifier output voltage jumps from the positive domain into the negative one. Thereby, the feedback resistor 97 displaces the positive bias voltage at the non-inverting input of the operational amplifier 94 in the negative direction and thereby assists the initiating cause. The measuring signal at the inverting amplifier input must then first become more negative by this displaced value, before the output voltage of the operational amplifier 94 returns to the original value. Due to this hysteresis, the circuit is comparable to a tip-switch. In consequence of the voltage jump from the positive to the negative domain of the output voltage of the operational amplifier 94, a negative charge current flows through the capacitor 98 and the resistor 99 and through the diode 100 to the negative feed voltage 101. The gate connection of the junction FET 24 is retained at negative feed voltage potential by way of resistor 109 by the resistor 102, whereby the junction FET 24 is cut-off. The negative gate voltage is increased by the threshold voltage of diode 100 by means of the negative charge current; and the junction FET 24 remains cut-off. When, after the peak pressure has passed, the measuring signal with the attainment of the corresponding switching point, effects a sudden change of the output voltage of the operational amplifier 94 from the negative domain back into the positive domain, a positive charge current flows through the capacitor 98 and the resistor 99 and through the diode 103 to ground at terminal 104. Consequently, the gate voltage of the junction FET 24 rises to the positive threshold voltage value of the diode 103. The junction FET 24 is rendered conductive thereby and sets the non-inverting input of the operational amplifier 91 to zero. As long as the positive charge current flows through the diode 103, namely, until the capacitor 98 has been charged to the positive limit voltage of the operational amplifier 94 minus the threshold voltage of the diode 103, the gate voltage remains at the threshold voltage value of the diode 103. In consequence of the charge current from the negative feed voltage, through the resistors 102 and 99 into the capacitor 98, it drops thereafter in the direction of the negative feed voltage and thereby cuts off the junction FET 24. For this, a defined negative voltage level is necessary which, depending upon the type of junction FET used, lies in the order of magnitude of a few volts. With the cut-off of the junction FET 24 occurring thereby, the attainment of this voltage terminates the short-circuit phase of the FET. After this instant of time, the measuring signal transmitted by the coupling capacitor 23 continues to have a falling tendency. Accordingly, the voltage level at the non-inverting input of the operational amplifier 91 should fall below zero. However, this is not possible, since negative voltage potential affects the inverting input of the operational amplifier 106 by way of the operational amplifier 91 and resistor 105. Together with the diode 92, this amplifier 106 forms a circuit for eliminating the diode threshold voltage in accordance with the principle of FIG. 6 and thus compensates a negative potential at the non-inverting input of the operational amplifier 91 by means of a positive charge current through the coupling capacitor 23. During this phase, the output voltage of the operational amplifier 106 rises only to the threshold voltage value of the diode 92, whereas the non-inverting input of the operational amplifier 91 and consequently also the signal output 93 is at zero potential. The diode 107 becomes functional when a signal of positive potential is transmitted by way of the coupling capacitor 23. By way of the operational amplifier 91 and the resistor 105, this signal affects the inverting input of the operational amplifier 106. Without the diode 107, the output of the operational amplifier 106 would be controlled into the negative domain. For this unnecessary voltage stroke, the operational amplifier 106 requires in practice a certain time which must be spent again when at a fresh negative measuring signal level the output voltage of the operational amplifier 106 is to rise from the negative domain to positive potential. Thereby, a troublesome delay in the compensation of the negative signal level at the non-inverting input of the operational amplifier 91 may occur. But with the diode 107, the output level of the operational amplifier 106, upon negative control, drops below the zero point merely by the threshold voltage potential of the diode 107. The maximum stroke of the output voltage of the operational amplifier 106 therefore results from the sum of the threshold voltages of the diodes 92 and 107 and in consequence of its lower value a faster response time than without the diode 107.

The control connection 108 is connected to the control, evaluation and indicator apparatus 70. As long as the unit maintains this line at zero potential, the transmission of the measuring signal is interrupted. In FIG. 7, the operational amplifier 94, together with the resistors 95 and 96, as well as the feedback resistor 97, forms the unit denoted as Schmitt trigger 67 in FIG. 5b. The capacitor 98 in conjunction with the resistors 99, 102 and 109 as well as the diodes 103 and 100 has the function of the unit denoted as monostable multivibrator 68 in FIG. 5b. Strictly speaking, this involves merely a time delay member with the required manner of operation.

The Schmitt trigger output signal is delivered during the measurement at the trigger output 110 for the formation of the sum of the transmitted signal cycles by the control, evaluation and indicator apparatus 70. This connection corresponds to the line 71 in FIG. 5b.

In a summarizing consideration of the circuit arrangement according to FIG. 7, it may be stated that this circuit solves the problems set for it with a minimum number of component parts. Also, the possibility exists to produce other circuits with similar or equal functions. However, the described circuit is characterized by particular simplicity and reliability.

The apparatus described heretofore serves for determining the level difference of an alternating voltage between a minimum and a next-following positive maximum. However, the apparatus may also serve for determining the difference between a minimum and a next-following negative maximum. For a measurement in this manner, the diodes 25, 82, 92, 107, 100 and 103 must be polarized in the reverse direction. In place of the junction FET 24 of the N-channel type, a P-channel type transistor must be used. The voltage divider made up of resistors 95 and 96 must be connected to the negative feed voltage, and the diode 100 with the resistor 102 may be connected to the positive feed voltage.

As to its manner of operation, the circuit may be considered as a self-regulating voltage compensator, wherein the compensation, subdivided into finite time intervals controlled by the measuring cycles, is effective only during the section of the time most favorable therefor. The zero point drift influence which still occurs therein is limited to the interval from the beginning of the rising measuring signal amplitude to the attainment of the peak value. In the case of peak pressure measurements in combustion engines, the resulting falsification of the measuring signal is negligibly small.

While I have shown and described several embodiments in accordance with the present invention, it is understood that the invention is not limited to the details shown and described herein but is intended to cover changes and modifications as known to one of ordinary skill in the art, and I therefore do not wish to be limited to the details shown and described herein but intend to cover all such changes and modifications as obvious to those skilled in the art.

What is claimed is:

1. An apparatus for minimizing zero drift in measuring the peak value of each cycle of a signal pulse of an electrical alternating voltage signal with respect to a predetermined reference value to enable also evaluation of the peak values over a defined number of N cycles, comprising:

circuit means normally transmitting the peak value of each cycle of the signal pulse of said alternating voltage to an output terminal;

means for restoring the level of said alternating voltage signal in said circuit means to a substantially constant and known value after reaching the peak value of a respective signal pulse and including further means connected to said circuit means and having first and second output signal levels constituting switch-on and switch-off levels;

means for retaining the signal level of said output terminal at substantially said value until the alternating voltage waveform of the signal pulse of the next cycle rises again above a predetermined level at which time said circuit means becomes operable again to transmit the signal pulse of the next cycle to said output terminal; and means connected to said output terminal for measuring the peak value of said alternating voltage with respect to said substantially constant and known value.

2. An apparatus according to claim 1, wherein said circuit means for applying said alternating voltage signal to the output terminal comprises a capacitor to which are applied the alternating voltage signals.

3. An apparatus according to claim 2, wherein said restoring means includes a switch means which is connected between said capacitor and a point having a predetermined reference value.

4. An apparatus according to claim 1, wherein said retaining means comprises an operational amplifier and a diode connected between the output and the inverting input of said amplifier, the inverting input of said amplifier being connected to said capacitor and the non-inverting input thereof being connected to a point having said predetermined reference value.

5. An apparatus according to claim 2, wherein said retaining means includes an operational amplifier connected as an impedance transformer between said capacitor and said output terminal.

6. An apparatus according to claim 1, wherein said retaining means comprises a first operational amplifier having its non-inverting input connected to said capacitor and an output as well as its inverting input connected to said output terminal, a second operational amplifier, first and second diodes connected in series between the inverting input of said second operational amplifier and the non-inverting input of said first operational amplifier, the point of connection of said diodes being connected to the output of said second operational amplifier, a resistor connected between the output of said first operational amplifier and the inverting input of said second operational amplifier, and the non-inverting input of said second operational amplifier being connected to a point having said predetermined reference value.

7. An apparatus according to claim 1, wherein said further means comprises a Schmitt trigger circuit.

8. An apparatus according to claim 7, wherein said further means includes a monostable multivibrator which is connected to the output of said Schmitt trigger circuit and is triggered by the resetting thereof, and an electrically controllable switch means connected to said multivibrator for connecting said circuit means to a point having said predetermined reference value while said multivibrator is in its triggered state.

9. An apparatus according to claim 8, wherein said Schmitt trigger circuit exhibits between its switch-on level and its switch-off level a hysteresis behavior having a value greater than any interference signals which may be superimposed on the signal applied to said circuit means.

10. A peak value measuring and evaluating apparatus according to claim 8, wherein said measuring means further comprises means for inhibiting measurement with respect to the first trigger pulse applied to said multivibrator after receipt of said external command signal.

11. An apparatus according to claim 1, wherein said further means comprises an operational amplifier having its inverting input connected to said output terminal, a voltage divider connected between a supply voltage and a point having said predetermined reference value, the non-inverting input of said operational amplifier being connected to said voltage divider, and a hysteresis value determining resistor connected between the non-inverting input of said operational amplifier and the output thereof.

12. An apparatus according to claim 11, wherein said further means comprises a further capacitor and a first resistor connected in series between the output of said last-mentioned operational amplifier and a junction point, first and second diodes connected in series between a supply voltage and a point having said predetermined reference value, the point of connection of said diodes being connected to said junction point, a second resistor connected between said junction point and said supply voltage, electrically-controllable switch means for selectively connecting said output terminal to a point having said predetermined reference value, and a third resistor connecting said junction point to said switch means.

13. An apparatus according to claim 12, wherein said electrically-controllable switch means is a junction field effect transistor.

14. An apparatus according to claim 1, wherein said measuring means includes means responsive to an external command signal for measuring the negative or positive peak values, respectively, of N voltage cycles applied to said output terminal, determining the arithmetic mean value of said N peak values, detecting the difference between the lowest and the highest peak value, and indicating the said arithmetic mean value and the said peak value difference.

15. An apparatus for minimizing zero drift in measuring the peak value of each cycle of a signal formed by an electrical alternating voltage with respect to a predetermined reference value so as to enable evaluation of said peak values over a given number of cycles, comprising:
first means for applying said signal to an output means;
second means including a selectively operable short circuit means operable with respect to a certain level in the voltage value of each signal after reaching its peak value for restoring said signal to a substantially constant and known value corresponding to said reference value by activating said short-circuit means for relatively short periods of time and said short-circuit means is inoperable to provide an open circuit except when activated; and
third means for retaining said value until the signal formed by the alternating voltage rises again to a predetermined level.

16. An apparatus for minimizing zero drift in measuring the peak values of each cycle of a signal formed by an electrical alternating voltage with respect to a predetermined reference value so as to enable evaluation of said peak values over a given number of cycles, comprising:
first circuit means for applying the alternating voltage signal to an output terminal;
second means for restoring a predetermined reference value during a respective signal but after each peak value of the signal and for temporarily interrupting transmittal of the signal by said first circuit means;
said second means including a MOSFET having a gate and being operable to short-circuit the first circuit means transmitting said signals, and said second means being operable to apply a voltage pulse to the gate of said MOSFET upon reaching a predetermined value in the trailing flank of each pulse to render said MOSFET conductive and thereby restoring the reference value to its predetermined value.

* * * * *